United States Patent [19]

Cornish et al.

[11] Patent Number: 4,767,951

[45] Date of Patent: Aug. 30, 1988

[54] ECL TO NMOS CONVERTER

[75] Inventors: Eldon C. Cornish; Rodney H. Orgill, both of Colorado Springs, Colo.

[73] Assignee: Hewlett-Packard Company, Palo Alto, Calif.

[21] Appl. No.: 68,384

[22] Filed: Jun. 30, 1987

[51] Int. Cl.$^4$ .......................................... H03K 19/094
[52] U.S. Cl. .................................... 307/475; 307/264; 307/444; 307/448
[58] Field of Search ............... 307/443, 448, 450, 475, 307/584–585, 264

[56] References Cited

U.S. PATENT DOCUMENTS

| | | | |
|---|---|---|---|
| 4,342,928 | 8/1982 | Gschwendtner et al. | 307/475 |
| 4,406,956 | 9/1983 | Clemen et al. | 307/475 |
| 4,437,171 | 3/1984 | Hudson et al. | 307/475 X |
| 4,647,798 | 3/1987 | Crafts et al. | 307/451 |
| 4,709,172 | 11/1987 | Williams | 307/451 X |

OTHER PUBLICATIONS

Freeman et al., "Level Shifting Circuit", IBM T.D.B., vol. 18, No. 5, Oct. 1975, p. 1450.
Lewis et al., "Bipolar Logic Level to FET Logic Level Buffer Circuit", IBM T.D.B., vol. 19, No. 8, Jan. 1977, pp. 2953–2954.

Primary Examiner—Stanley D. Miller
Assistant Examiner—D. R. Hudspeth
Attorney, Agent, or Firm—Edward L. Miller

[57] ABSTRACT

A circuit for coupling ECL level logic signals to NMOS circuitry first translates the ECL logic swing from the range of $-1.6$ v to $-0.8$ v up to the range of about $+0.5$ v to $+1.3$ v. This is done by driving the source of an enhancement device with the ECL input signal. This has the further benificial effect of compensating for temperature changes and process related variables. The level shifted signal is then applied to a gain stage for amplification and delivery to the using circuits. If the ECL input signal is available in complementary form then the complement can be used to drive the source of the gain stage; otherwise it should be connected to $V_{ref}$ of the ECL circuitry.

4 Claims, 2 Drawing Sheets

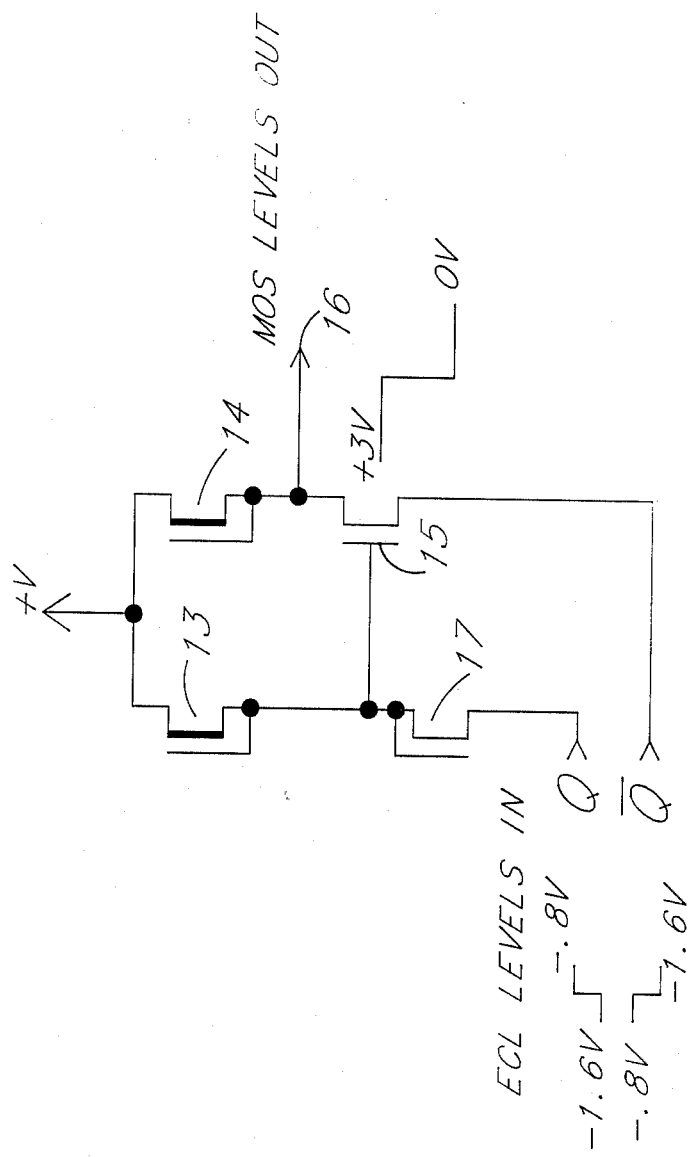

ECL TO NMOS CONVERTER

BACKGROUND AND SUMMARY OF THE INVENTION

In many systems there is a need to interface circuitry of one logic family with that of another. For example, it may be necessary to apply signals generated with emitter coupled logic (ECL) devices to metal oxide field effect transistors (MOS). Not only are the ON and OFF states of the two families represented by different voltages, but MOS thresholds are often described as "mushy". By this is meant that MOS does not exhibit a narrow voltage range around some threshold voltage within which a voltage applied to the gate will cause the transistor to turn completely on or completely off. In contrast, bipolar devices usually switch within a fifty to one hundred millivolt region around their threshold voltage, whereas in an MOS device the corresponding region may be one and a half volts. ECL levels however, are commonly from $-1.6$ v to $-0.8$ v. It is evident then, that an interface circuit to couple ECL levels to MOS devices must not only take level shifting into account, but must also actually increase the size of the logic swing available from ECL.

In one aspect of the instant invention these objectives are achieved by applying the ECL input to the source of a level-shifter enhancement device whose gate is connected to its drain, which in turn is connected both to the power supply through a load (such as a depletion device) and to the gate of a gain stage comprised of another enhancement device and a load. The output of the gain stage is a signal of three voltages transition suitable for driving MOS logic devices. In another aspect of the invention the source of the gain stage is driven by an ECL signal that is the complement of the ECL signal applied to the source of the level-shifter. By putting the level-shifter on the same substrate as the other MOS circuitry that is to use the converted signals the effects of threshold level changes as a function of temperature are compensated automatically.

BRIEF DESCRIPTION OF THE DRAWING

FIG. 3 is a schematic of a second ECL to NMOS interface circuit constructed in accordance with another aspect of the invention

DESCRIPTION OF A PRIOR SOLUTION

Figure 1:
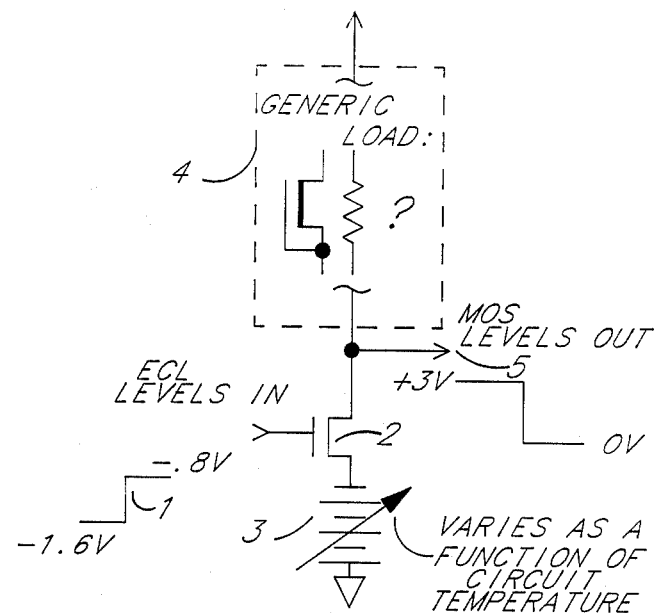
FIG. 1 is a schematic of a prior art solution to the problem of interfacing ECL circuits to NMOS circuits.

Referring now to FIG. 1, shown therein is a simplified schematic view of a prior art solution to the problem of coupling ECL outputs to NMOS circuuits. An ECL input 1 that varies between $-1.6$ v and $-0.8$ v is applied to the gate of an enhancement NMOS device 2 whose source is connected to a variable voltage bias supply (typically $-3.2$ v, assuming a 2 v gate to source drop across device 2) and whose drain is connected to the power supply through some sort of load 4. An ouput 5 suitable for use with NMOS devices is produced at the junction of the drain of device 2 and load 4. A disadvantage of this circuit is that the variable bias supply 3 must be constructed to produce a custom voltage determined by process considerations and then vary that voltage as a function of the temperature of the MOS devices. This is necessary if the MOS levels out are not to shift as a result of temperature changes in the MOS devices.

DESCRIPTION OF A PREFERRED EMBODIMENT

Figure 2:
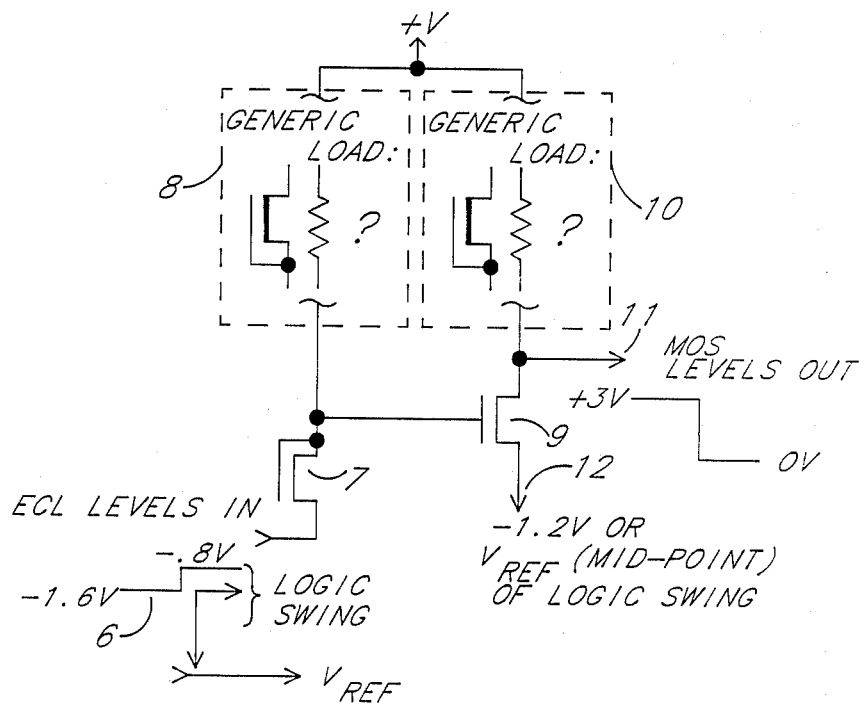
FIG. 2 is a schematic of a first ECL to NMOS interface circuit constructed in accordance with one aspect of the invention.

Now consider the circuit of FIG. 2. An ECL level signal 6 is applied to the source of an enhancement device 7 whose gate is connected to the drain of device 7. The drain is connected through a load of some sort to the power supply. A typical load would be a depletion device. The drain of device 7 is also connected to the gate of an enhancement device 9. The source of device 9 is connected to a voltage $V_{ref}$ that is generally supplied by the ECL circuitry. $V_{ref}$ is maintained in the middle of the logic swing of the ECL signal levels, and is typically $-1.2$ v. An MOS level output 11 is produced at the drain of enhancement device 9.

In operation the circuit of FIG. 2 functions as follows. Device 7 operates as a temperature sensitive level shifter to translate the incoming ECL levels from the range of $-1.6$ to $-0.8$ v up to the range of $+0.5$ v to $+1.3$ v. The exact amount of the translaton will depend upon the temperature as well as the particulars of the process (doping levels, etc.) used in device fabrication. What is important to recognize is that all the other MOS decives on the same substrate will have the same sensitivity to temperature and will have been fabricated using the same process variables. Thus, device 7 does more than mere level shifting; it also compensates for temperature changes and process variations.

The level shifted and compensated signal at the drain of device 7 is applied to the gate of a gain stage comprised of device 9 and load 10. This amplifies the logic swing of approximately 800 millivolts into one of approximately three volts.

Perhaps the most typical case for loads 8 and 10 is to fabricate them out of depletion devices, although other possibilities exist. When the loads are depletion devices certain ratios of devices sizes are desirable. Specifically, the size of device 8 should be to the size of device 7 as the size of device 10 is to device 9.

FIG. 3 shows a variation on the circuit of FIG. 2. This circuit is useful when the ECL signal to be interfaced is available as a complementary pair. In such a case the voltage $V_{ref}$ may dispensed with in favor of applying the signal and its complement to the sources of devices 17 and 15, respectively. This has the advantage of appearing to double the gain of the gain stage 15/14, and of reducing the transisition time of the output signal 16.

We claim:

1. A circuit for coupling an ECL logic input signal to MOS logic levels, the circuit comprising:

a first enhancement MOS transistor having its gate connected to its drain, and having its source coupled to the ECL logic input signal;

a first load connected between a power supply and the drain of the first MOS transistor, a second enhancement MOS transistor whose gate is coupled to the junction of the first load and the first MOS transistor, whose source is coupled to a reference voltage representing the mean of the logic levels of the ECL logic input signal, and whose drain is connected to the second load recited below; and a second load connected between the drain of the second MOS transistor and the power supply, the output of the circuit being the junction of the second load and the drain of the second MOS transistor.

2. A circuit as in claim 1 wherein the first and second loads comprise depletion MOS transistors.

3. A circuit for coupling a complementary pair of ECL logic input signals to MOS logic levels, the circuit comprising:
- a first enhancement MOS transistor having its gate connected to its drain, and having its source coupled to one of the ECL logic input signals in the pair thereof;
- a first load connected between a power supply and the drain of the first MOS transistor;
- a second enhancement MOS transistor whose gate is coupled to the junction of the first load and the first MOS transistor, whose source is coupled to the other ECL logic input signal in the pair thereof, and whose drain is connected to the second load recited below; and
- a second load connected between the drain of the second MOS transistor and the power supply, the output of the circuit being the junction of the second load and the drain of the second MOS transistor.

4. A circuit as in claim 3 where the first and second loads comprise depletion MOS transistors.

* * * * *